(12) United States Patent
Nagase

(10) Patent No.: US 7,057,396 B2
(45) Date of Patent: Jun. 6, 2006

(54) DISCONNECTION DETECTING CIRCUIT FOR SENSOR APPARATUS

(75) Inventor: Kazuyoshi Nagase, Aichi-ken (JP)

(73) Assignee: Denso Corporation, Kariya (JP)

(*) Notice: Subject to any disclaimer, the term of this patent is extended or adjusted under 35 U.S.C. 154(b) by 25 days.

(21) Appl. No.: 10/803,928

(22) Filed: Mar. 19, 2004

(65) Prior Publication Data

US 2004/0189323 A1 Sep. 30, 2004

(30) Foreign Application Priority Data

Mar. 31, 2003 (JP) ............................. 2003-095064

(51) Int. Cl.
*G01R 27/02* (2006.01)

(52) U.S. Cl. ..................................... 324/537; 324/609

(58) Field of Classification Search ................ 324/537, 324/522, 73.1, 511, 609
See application file for complete search history.

(56) References Cited

U.S. PATENT DOCUMENTS

| | | | | |
|---|---|---|---|---|
| 3,826,977 A | * | 7/1974 | Woodworth | ................. 324/556 |
| 4,801,869 A | * | 1/1989 | Sprogis | ....................... 714/733 |
| 5,357,191 A | * | 10/1994 | Grace | .......................... 324/754 |
| 5,422,568 A | * | 6/1995 | Hashizume et al. | ......... 324/166 |
| 5,615,216 A | * | 3/1997 | Saeki | .......................... 714/724 |
| 6,449,207 B1 | * | 9/2002 | Sher et al. | ................... 365/226 |
| 6,943,559 B1 | * | 9/2005 | Yamaoka et al. | ........... 324/537 |

FOREIGN PATENT DOCUMENTS

| | | |
|---|---|---|
| JP | 5-107292 | 4/1993 |
| JP | 8-146069 | 6/1996 |

* cited by examiner

*Primary Examiner*—Anjan Deb
(74) *Attorney, Agent, or Firm*—Posz Law Group, PLC

(57) ABSTRACT

In a disconnection detecting circuit comprising a control circuit and a sensor circuit, an energizing current is supplied from the control circuit side through an output terminal to the sensor circuit side by energizing a transistor in the sensor circuit side directly in a state where a pull-up resistor or a pull-down resistor having a several kΩ to several tens kΩ is provided in the control circuit side. In addition, a current control circuit, a constant-current circuit, a bias circuit and a transistor unit are provided in the sensor circuit side so that, at the occurrence of a disconnection of a power supply line, the impedance of the sensor circuit side is set to be higher by at least one-digit than the resistance value of the pull-up resistor in the control circuit side. This enables detecting a disconnection of connection lines between circuits while preventing an increase in contact resistance of terminal contacts to the utmost.

9 Claims, 6 Drawing Sheets

DISCONNECTION DETECTING CIRCUIT FOR SENSOR APPARATUS

BACKGROUND OF THE INVENTION

1. Field of the Invention

The present invention relates to a sensor apparatus disconnection detecting circuit comprising a control circuit and a sensor circuit including a functional circuit having one or a plurality of transistors for outputting a sensor signal to the control circuit upon receipt of power supply from the control circuit in a state where a plurality of connection lines and terminals are interposed between the control circuit and the sensor circuit, with the disconnection detecting circuit being made to detect a disconnection or breakage of at least one of the connection lines.

2. Description of the Related Art

So far, for example, in a sensor apparatus mounted in a vehicle, a sensor circuit and a control circuit (for example, ECU) have been connected to each other through a plurality of connection lines (for example, power supply lines, sensor signal lines and ground connection lines) and terminals Vcc, Vout, GND and others.

In FIGS. 6A and 6B schematically showing an interface section, a control circuit 1 and a sensor circuit 2 are connected to each other through a plurality of connection lines 3 to 5 (a power supply line 3, a sensor signal line 4, a ground connection line 5). In this configuration, a circuit is provided to detect the connection conditions therebetween in case of disconnection of at least one of these connection lines 3 to 5 for some reason.

On the control circuit 1 side, for the detection of disconnection of the connection lines 3 to 5 between the control circuit 1 and the sensor circuit 2, as shown in FIGS. 6A and 6B, a pull-up resistor 6 (or a pull-down resistor 7) is connected to a power supply circuit 8 to be placed in parallel in an internal terminal of the control circuit 1 to set the ratio of the impedances (that is, the pull-up resistor 6 or the pull-down resistor 7 and a resistance value R0) of the control circuit 1 and the sensor circuit 2 to an extreme value (approximately 15 to 20:1).

In this arrangement, in a case in which at least one (for example, the sensor signal line 4) of the connection lines 3 to 5 falls into a disconnected condition for some reason, a voltage to be applied to a terminal Vin on the control circuit 1 side approaches a power supply voltage (or a ground voltage) on the basis of a variation of current flowing in the pull-up resistor 6 (or pull-down resistor 7). Accordingly, if this power supply voltage (or the ground voltage) is set out of an input voltage range in a normal operation of an internal circuit 9 of the control circuit 1, the internal circuit 9 of the control circuit 1 can detect this voltage to detect the disconnection of at least one of the connection lines 3 to 5. As one example of disconnection detection on this principle, there has been known a disconnection detecting apparatus disclosed in Japanese Patent laid-Open No. HEI 5-107292.

Meanwhile, so far, a gold-plate-treated terminal has been employed as a terminal to be used for the electrical connections between the control circuit 1 and the sensor circuit 2 through the connection lines 3 to 5 and, in this case, in FIGS. 6A and 6B, the disconnection detection is made in a manner such that the value of the pull-up resistor 6 is set at approximately several hundreds kΩ and the resistance value R0 of a resistance element connected to an internal side of a terminal of the sensor circuit 2 is adjusted to produce an impedance for an impedance ratio (approximately 15 to 20:1) relative to the first-mentioned resistance value.

However, according to the recent required specifications, a low-priced terminal tin-plate-treated (which will be referred to as hereinafter as a "tin-plate terminal), in place of the gold-plate treatment, has also been put to use. On the other hand, this raises fears that the contact resistance increases with the deterioration of the contacts of the tin-plate terminal and, hence, there is a need to increase the energizing current to the tin-plate terminal in a normal operation in a manner such that the value of the pull-up resistor 6 is made lower than before to be in a range between several kΩ and several tens kΩ. If the value of the pull-up resistor 6 on the control circuit 1 side is set at several kΩ to several tens kΩ, a difference of approximately one to two digits appears with respect to the conventional case, which creates a problem even if, as well as the conventional case, the change of the resistance value R0 is made to detect a disconnection while meeting that specification.

That is, for the impedance of the sensor circuit 2 at the occurrence of a disconnection to be extremely lower than the value of the pull-up resistor 6 (or pull-down resistor 7) on the control circuit 1 side, for example, as compared to the conventional case, there is a need to further decrease the value R0 (impedance) of a resistor connected in parallel to an internal side of the sensor circuit 2 side terminal. However, since the current flowing in the resistor connected to this terminal increases considerably due to the relationship between resistance values in a normal operation, it leads undesirably to increasing the useless current flowing in that resistor R0.

SUMMARY OF THE INVENTION

The present invention has been developed in consideration of the above-mentioned situations, and it is therefore an object of the invention to provide a disconnection detecting circuit capable of detecting a disconnection of a connection line between circuits in a state where a useless current dissipation stemming from a current flow in a resistance element connected to an inside of a terminal of a sensor circuit is brought under control while avoiding an increase in contact resistance at terminal contacts to the utmost by increasing the energizing current with respect to a terminal to which a connection line is connected in a normal operation.

For this purpose, according to an aspect of the present invention, in a normal operation, an energizing current is supplied directly from a control circuit through a terminal to a collector or drain of a transistor in a sensor circuit side. This can increase the energizing current flowing in the terminal only by adjusting the control circuit side in advance in the normal operation, which can prevent an increase in contact resistance of the terminal of the sensor circuit to the utmost and can suppress a useless dissipation of current flowing in a resistor connected so far to an inside of the terminal of the sensor circuit. Moreover, at the occurrence of a disconnection of a connection line, the sensor circuit side impedance is set to be higher than the control circuit side impedance, which enables the detection of the disconnection of the connection line put between the control circuit and the sensor circuit. Preferably, the ratio of the impedances of the sensor circuit and the control circuit at the disconnection of the connection line is approximately one-digit, more preferably, more than two-digit (that is, several tens, several hundreds to 1 (approximately 10 or more: 1).

In addition, according to a further aspect of the present invention, in the above-mentioned arrangement, reverse current checking means checks (prevents) the reverse current (flow reversals) of a transistor of the functional circuit at the occurrence of a disconnection of the connection line, which prevents the malfunction of the transistor during the disconnection of the connection line.

Meanwhile, depending upon an internal arrangement of the sensor circuit, when a current flows in or out from the connection line connected to the terminal of the sensor circuit, it is considered that, for example, a voltage drop occurs in a pull-up resistor or a pull-down resistor provided in the control circuit side even as a disconnection occurs in a connection line so that the voltage does not get out of an input voltage range in the normal operation, which makes it difficult to reliably detect the disconnection on the control side.

Therefore, according to a further aspect of the present invention, in the above-mentioned arrangement, when the functional circuit has one or a plurality of amplification circuits and the amplification circuit includes an output side amplification circuit capable of inputting/outputting a direct-current signal from an output terminal of the sensor circuit through the connection line, for the purpose of checking a reverse current in a transistor of the output side amplification circuit at the occurrence of a disconnection of the connection line, in particular the reverse current checking means can cut off (interrupt) a current path stemming from the reverse current of the transistor, check a current flowing in/out from a sensor signal line, prevent the voltage from not becoming out of an input voltage range when a voltage drop occurs in the control circuit side at the occurrence of a disconnection of the connection line, and detect a disconnection with high reliability on the control circuit side.

Moreover, at this time, the amplification circuit is driven upon receipt of the supply of a current from a constant-current circuit, and the output side amplification circuit is equipped with an output current source arranged in the form of a current mirror circuit. Preferably, the constant-current circuit for the supply of a current to the output current source is provided independently of a constant-current circuit for an amplification circuit other than the output side amplification circuit. In this case, a current path between constant-current circuits disappears which can act for transmissions of a current flowing in/out from the sensor signal line at the occurrence of a disconnection of a connection line, which prevents the current from entering a constant-current circuit for the supply of a current to an amplification circuit other than the output side amplification circuit to cut off the current path of the constant-current circuit for the supply of a current to an amplification circuit other than the output side amplification circuit so that the control circuit side can detect the occurrence of a disconnection with high reliability even if provided is an output current source arranged in the form of a current mirror circuit.

Still additionally, according to a further aspect of the present invention, in the above-mentioned arrangement, the transistor is a PNP bipolar transistor, and a collector of the PNP transistor is connected to a power supply bus side producing a lower side reference electric potential in an operation of the functional circuit. In this case, the reverse current checking means is interposed between the collector of the PNP transistor and the power supply bus having the lower side reference electric potential to check the reverse current in the PNP transistor, which prevents the inflow of a current from the power supply bus forming the lower side reference electric potential of the PNP transistor. This prevents the function of the PNP transistor connected to the power supply bus side having the lower side reference electric potential from being unstable, which can cut off the current path even if the collector of the PNP bipolar transistor is connected to the power supply bus side having the lower side reference electric potential, thus achieving the high-reliability detection of a disconnection.

Yet additionally, according to a further aspect of the present invention, in the above-mentioned arrangement, the functional circuit includes an amplification circuit having one or a plurality of transistors. In this case, a current control circuit cuts off an operational current flowing in the amplification circuit at the occurrence of a disconnection of a connection line to place the function of the amplification circuit into a stopped condition, which prevents a current flowing in/out from the sensor signal line at the occurrence of a disconnection of the connection line from flowing through the optical current path into the amplification circuit to cut off the current path running to the amplification circuit so that the control circuit side can achieve a high-reliability detection of a disconnection on the control circuit side even if the amplification circuit is put to use in the sensor circuit side.

Moreover, according to a further aspect of the present invention, in the above-mentioned arrangement, the amplification circuit includes an output side amplification circuit capable of inputting/outputting a direct-current signal from a terminal of the sensor circuit through the connection line. In this case, the current control circuit cuts off an operational current flowing in the output side amplification circuit at the occurrence of a disconnection of a connection line, thus particularly cutting off the current path to the output side amplification circuit so that the control circuit side can detect the disconnection with high reliability.

Still moreover, according to a further aspect of the present invention, in the above-mentioned arrangement, the current control circuit is constructed with a current mirror circuit comprising a first transistor to which a current is inputted from the power supply bus of the sensor circuit and a second transistor whose first and second transistor control terminals are connected to each other, and a resistance element is connected between the power supply bus of the sensor circuit and the transistor control terminals. This can stably cut off the operational current of the amplification circuit.

Furthermore, according to a further aspect of the present invention, in the above-mentioned arrangement, the transistor is a bipolar transistor, and a current checking means checks the supply of a base current to the bipolar transistor. This can prevent the bipolar transistor from functioning particularly at the occurrence of a disconnection of a connection line to cut off the current path through the bipolar transistor, thus achieving a high-reliability detection of a disconnection particularly even if the bipolar transistor is used in the sensor circuit side.

Still furthermore, according to a further aspect of the present invention, in the above-mentioned arrangement, the reverse current checking means or the current checking means is constructed by reverse-connecting a diode or a diode-connected transistor. This can achieve the reverse current prevention or the current check with a simple arrangement.

In the present invention and in this specification, the "disconnection" is a general term for electrical interruptions, including disconnections (for example, the electrical cutting of a connection line placed between circuits) in the general senses of electrical interruptions, the removal of a connection line (for example, a connection line between circuits gets out of place with respect to a terminal), and the like. Moreover, the "reverse current" of the transistor also signifies, for example, in the case of a PNP bipolar transistor, a current flowing in through the PN junction between a collector and base of this transistor.

BRIEF DESCRIPTION OF THE DRAWINGS

Other objects and features of the present invention will become more readily apparent from the following detailed description of the preferred embodiments taken in conjunction with the accompanying drawings in which.

DESCRIPTION OF THE PREFERRED EMBODIMENTS

Referring to FIGS. 1 to 4B, a description will be given hereinbelow of a first embodiment in which the present invention is applied to a disconnection detecting circuit for a pressure sensor apparatus mounted in a vehicle.

Figure 2:
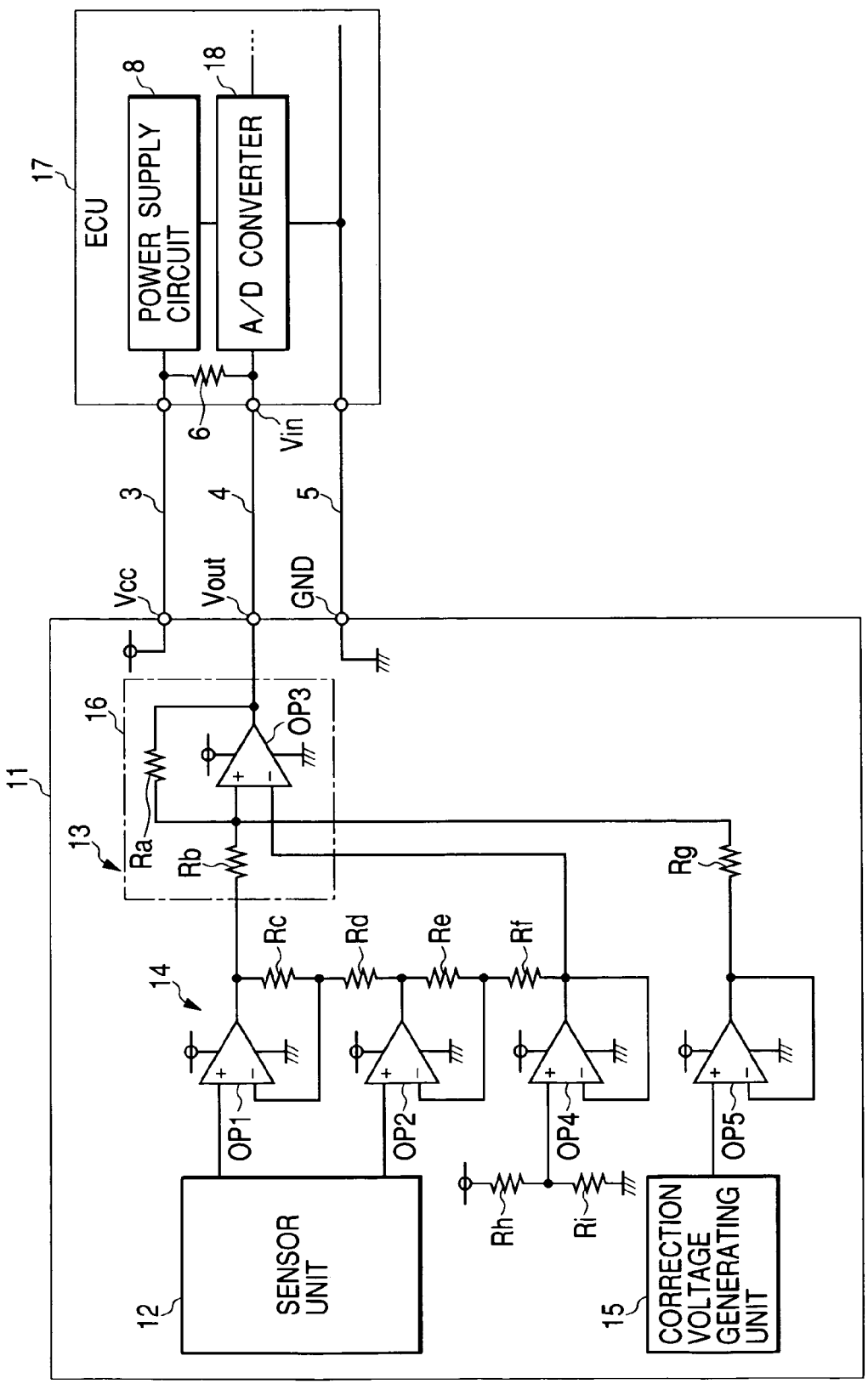
FIG. 2 is an illustration of an electrical arrangement of a control circuit and a sensor circuit according to this first embodiment.

So far, a pressure sensor apparatus has been mounted in a vehicle (car) to be used for various control of vehicle states. This pressure sensor apparatus is equipped with a sensor circuit 11 for outputting a sensor signal. FIG. 2 schematically shows an electrical arrangement of the pressure sensor apparatus. This sensor circuit 11 is one example, and it is also appropriate to remove a portion of the arrangement when needed or add a circuit when needed, if it achieves the present invention.

The sensor circuit 11 operates when a power supply voltage having an upper side reference electric potential (for example, +5V) and a lower side reference potential (for example, 0V) is applied from an external ECU 17 to between a power supply terminal Vcc and a ground terminal GND. The sensor circuit is principally made up of a sensor unit 12 and 13 plural-stage amplification processing unit 13. The sensor unit 12 is made using a semiconductor chip having a relatively large piezoresistance coefficient and is made to output a detection signal with a voltage level corresponding to an applied pressure.

The amplification processing unit 13 principally comprises plural-stage amplification circuits including a plurality of operational amplifiers OP1 . . . OP3 and a plurality of resistors Ra to Rf, and a detection signal from the sensor unit 12 is amplification-processed through first-stage to output-stage amplification circuits 14, 16 so that a sensor signal is outputted from an output terminal Vout of the sensor circuit 11.

A description will be given hereinbelow of connections among the components. An output terminal of the operational amplifier OP1 is connected through the resistor Rc to its inverting input terminal. This inverting input terminal of the operational amplifier OP1 is connected through the resistor Rd to an output terminal of the operational amplifier OP2. Moreover, the output terminal of the operational amplifier OP2 is connected through the resistor Re to its inverting input terminal, and this inverting input terminal is connected through the resistor Rf to an output terminal of the operational amplifier OP4. The operational amplifier OP4 functions as a voltage follower and is made to apply, to an inverting input terminal of the operational amplifier OP3, a divided voltage produced through reference voltage production resistors Rh and Ri. A detection signal from the sensor unit 12 are applied to non-inverting input terminals of the operational amplifiers OP1 and OP2.

At this time, the detection signal from the sensor unit 12 is amplified through the use of the first-stage amplification circuit 14 arranged by combining the operational amplifiers OP1, OP2 and the resistors Rc to Rf, and a correction signal comprising a direct-current voltage generated from a correction voltage generating unit 15 is fed through a voltage follower (arranged by an operational amplifier OP5) to the output-stage amplification circuit 16 (arranged by a combination of the operational amplifier OP3 and the resistors Ra and Rb) so that the correction signal is added to an amplified signal amplified by the amplification circuit 14 and is outputted as a sensor signal from the output terminal Vout to be given through an input terminal Vin to an ECU 17.

The ECU (engine control unit; corresponding to a control circuit) 17 is provided with respect to the sensor circuit 11 and constitutes a pressure sensor apparatus. This ECU 17 contains an A/D converter 18 (constituting the internal circuit 9 in the conventional example) and a power supply circuit 8 and is provided separately from the sensor circuit 11. This ECU 17 is connected through three connection lines 3 to 5 to the sensor circuit 11. Each of these connection lines 3 to 5 is made with a vehicle wire harness.

Moreover, when the ECU 17 supplies a power supply voltage from the power supply circuit 8 to between the power supply line 3 and the ground connection line 5, the sensor circuit 11 outputs and supplies a sensor signal through the output terminal Vout, and the ECU 17 receives this sensor signal, and the sensor signal is inputted to the A/D converter 18 serving as an internal circuit for the first-stage signal processing. A pull-up resistor 6 or a pull-down resistor 7 is connected to an input terminal in the interior of the ECU 17, and an energizing current is supplied through the terminals Vin and Vout and the sensor signal line 4 to the sensor circuit 11 side. For example, the impedance of the A/D converter 18 is close to 1 MΩ and is considerably higher than the pull-up resistor 6 and the pull-down resistor 7.

This A/D converter 18 conducts the conversion processing on an inputted sensor signal (direct-current signal) into a digital form which is in turn given to an internal controller (not shown; constituting an internal circuit). At this time, if the voltage from the A/D converter 18 is, for example, in an input voltage range of approximately 0.5 to approximately 4.5V, the controller carries out the control on each part of the vehicle upon receipt of the sensor signal from the sensor circuit 11. On the other hand, when receiving a voltage (approximately 0 to 0.49V, approximately 4.51 to 5V) out of the input voltage range in the normal operation through the A/D converter 18, the controller makes a decision that a disconnection has occurred and, for example, notifies this decision result to the external.

Secondly, a detailed description will be given hereinbelow of an arrangement of the output-stage amplification circuit 16.

\<About Output-Stage Amplification Circuit 16\>

Figure 1:
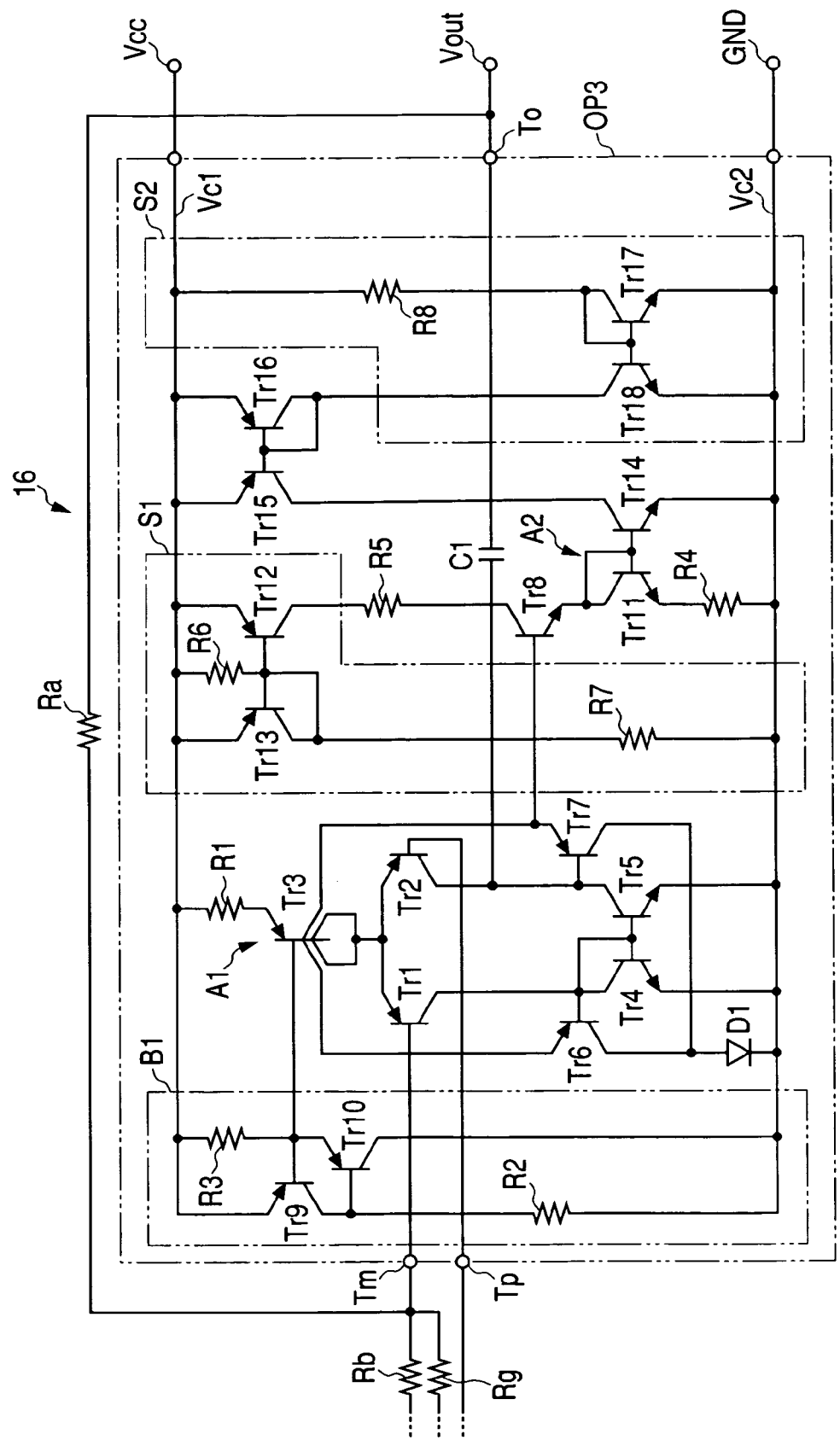
FIG. 1 is an illustration of an electrical arrangement of a portion of a sensor circuit according to a first embodiment of the present invention.

FIG. 1 schematically shows an electrical arrangement of an output-stage amplification circuit.

As mentioned above, this amplification circuit 16 is made to add an amplified signal, amplified in the first-stage amplification circuit 14, to a correction signal generated from the correction voltage generating unit 15. The amplification circuit 16 forms a negative-feedback amplification circuit in which an output terminal To of the operational amplifier OP3 is connected through a feedback resistor Ra to an inverting input terminal Tm thereof.

\<About Internal Arrangement of Operational Amplifier OP3\>

A description will be given hereinbelow of an internal arrangement of the operational amplifier OP3. In this embodiment, the operational amplifiers OP1 to OP3 have the same arrangement.

The inverting input terminal Tm of the operational amplifier OP3 is connected to the base of a PNP transistor Tr1, while the non-inverting input terminal Tp of the operational amplifier OP3 is connected to the base of a PNP transistor Tr2. The emitters of the differential input transistors Tr1 and Tr2 constituting a differential input portion of a differential amplification circuit A1 are connected in common to each other, and connected between the collector and emitter of a multi-collector type PNP transistor Tr3 constituting a constant-current circuit and further through a current limiting resistor R1 to a power supply line Vc1 and a power supply terminal Vcc.

An active load (load circuit) comprising NPN transistors Tr4 and Tr5 is connected between the collectors of the transistors Tr1, Tr2 and the ground terminal GND. These transistors Tr4 and Tr5 establish a circuit similar to a current mirror circuit.

A common connection point between the transistors Tr1 and Tr4 is connected to the base of a PNP transistor Tr6. The collector of this transistor Tr6 is connected through the anode-cathode (between the anode and the cathode) of a diode D1 to a ground line Vc2 and the ground terminal GND. Moreover, the emitter of the transistor Tr6 is connected to the collector of the transistor Tr3. The aforesaid diode D1 corresponds to a reverse current checking means.

On the other hand, a common connection point between the transistors Tr2 and Tr5 is connected to the base of a PNP transistor Tr7. The collector of this transistor Tr7 is connected through the anode-cathode of the diode D1 to the ground line Vc2 and the ground terminal GND. Moreover, the emitter of the transistor Tr7 is connected to the collector of the transistor Tr3 and further connected to the base of an NPN transistor Tr constituting the output side amplification circuit. These connections of the resistor R1 and the transistors Tr1 to Tr7 form the differential amplification circuit A1. A common connection point between the collector of the transistor Tr2 and the collector of the transistor Tr5 is connected through a phase compensation capacitor C1 to the output terminal To of the operational amplifier OP3.

\<About Bias Circuit B1\>

A bias circuit B1 functioning as a current control circuit is provided for driving the aforesaid differential amplification circuit A1. Between the power supply line Vc1 and the ground line Vc2, there are connected the emitter-collector (between the emitter and the collector) of a PNP transistor Tr9 and a resistor R2. Moreover, likewise, between the power supply line Vc1 and the ground line Vc2, there are connected a resistor R3 and the emitter-collector of a PNP transistor Tr10.

A common connection point between the collector of the transistor Tr9 and the resistor R2 is connected to the base of the transistor Tr10, and a common connection point between the resistor R3 and the emitter of the transistor Tr10 is connected in common to the bases of the transistors Tr9 and Tr3. In this way, the bias circuit B1 is constructed through the use of the resistors R2, R3 and the transistors Tr9, Tr10.

A transistor Tr8 organizing an output side amplification circuit A2 is connected, at its emitter, to the collector and base of an NPN transistor Tr11, and the emitter of this transistor Tr11 is connected through a resistor R4 to the ground terminal GND. Thus, the transistor Tr11 is diode-connected to correspond to the current checking means in the present invention.

On the other hand, the collector of the transistor Tr8 is connected through a resistor R5 and the collector-emitter of a PNP transistor Tr12 to the power supply line Vc1.

The transistor Tr12 constitutes a current control circuit S1 for the output side amplification circuit.

\<About Current Control Circuit for Output Side Amplification Circuit A2\>

For the control of the current to the output side amplification circuit A2, a current control circuit (corresponding to the current control circuit in the present invention) S1 is provided for the output side amplification circuit A2. The connections in this current control circuit S1 are as follows. Between the power supply line Vc1 and the ground line Vc2, a diode-connected PNP transistor Tr13 (corresponding to the first transistor) and a resistor R7 are connected in series, thus constructing a bias circuit. Moreover, the bases (corresponding to the control terminal) of the transistors Tr13 and Tr12 are connected to each other. A resistor R6 is connected between the base of the transistor Tr12 (corresponding to the second transistor) and the power supply line Vc1, thereby producing the current control circuit S1 comprising a current mirror circuit through the use of the resistors R6, R7 and the transistors Tr12, Tr13.

In addition, the base of the transistor Tr11 is connected to the base of an NPN transistor Tr14 constituting the output side amplification circuit A2, and the emitter of the transistor Tr1 is connected to the ground line Vc2. The collector of the transistor Tr14 is connected to the output terminal To of the operational amplifier OP3 and further to the collector of a PNP transistor Tr15. Still additionally, at this time, since a resistance element (see the resistor in the conventional example (resistance value Ro)) is not connected to the output terminal Vout of the operational amplifier OP3 on the sensor circuit 11 side, the sensor circuit 11 side impedance varies in accordance with the functional situations of the transistors Tr14 and Tr15. The output side amplification circuit A2 is basically composed of the transistors Tr8, Tr14 and the resistors R5, R4.

The emitter of the transistor Tr15 is connected to the power supply line Vc1, and the base of the transistor Tr15 is connected to the base and collector of a PNP transistor Tr16. The emitter of the transistor Tr16 is connected to the power supply line Vc1. A constant-current circuit S2 comprising a current mirror circuit is constructed for supplying a constant current to the transistor Tr16.

That is, this constant-current circuit S2 is provided separately from the constant-current circuit (comprising the transistor Tr3 and the resistor R1) for the supply to the differential amplification circuit A1. For this constant-current circuit S2, a resistor R8 and a diode-connected NPN transistor Tr17 are connected between the power supply line Vc1 and the ground line Vc2 to set a bias current, and the base of the transistor Tr17 is connected in common to the base of an NPN transistor Tr18, and the collectors of the transistors Tr18 and Tr16 are connected to each other, thereby supplying a constant current to the transistors Tr15 and Tr16. Owing to the supply of the constant current in this way, the transistors Tr15 and Tr16 function as an output current source for the output side amplification circuit.

A description will be given hereinbelow of an operation of the above-described arrangement.

The amplification circuit comprising the operational amplifiers OP1 to OP3 shown in FIG. 2 functions as a normal amplification circuit in the normal operation, and if the pull-up resistor 6 is set at several kΩ to several tens kΩ in advance, an energizing current flows from the output terminal Vout of the sensor circuit 11 into the collector of the transistor Tr14 of the operational amplifier OP3 in the normal operation so that a larger current than in the conventional case can flow to the output terminal Vout. Moreover, if the pull-down resistor 7 is set at several kΩ to several tens kΩ in advance, an energizing current flows out from the collector of the transistor Tr15 of the operational amplifier OP3 through the output terminal Vout of the sensor circuit 11 so that a larger current than in the conventional case can flow to the output terminal Vout.

Accordingly, even if the output terminal Vout is made at a low cost by being tin-plate-treated instead of being gold-plate-treated, through the adjustment of the resistance value of the pull-up resistor 6 or the pull-down resistor 7, an increase in contact resistance of the contact of the output terminal Vout is preventable to the utmost. Incidentally, although the terminal is the output terminal Vout of the sensor circuit 11 and the like, it is also applicable to the input terminal Vin in the ECU 17 side.

A description will be given hereinbelow of an operation according to the present invention in a case in which the connection lines 3 to 5 fall into a disconnected condition. As the issues at the disconnection of the connection lines 3 to 5, there are two patterns shown in FIGS. 3A and 3B. That is, (a) the disconnection of the power supply line 3 in a state where the pull-up resistor 6 is connected in the ECU 17 side; and (b) the disconnection of the ground connection line 5 in a state where the pull-down resistor 7 is connected in the ECU 17 side.

As other than these issues, there are (c) the disconnection of the sensor signal line 4, (d) the disconnection of the ground connection line 5 in the pull-up resistor 6 connection state in the ECU 17 side, (e) the disconnection of the power supply line 3 in the pull-up resistor 6 connection state in the ECU 17 side and (f) the disconnection of any two or more of the connection lines. In these cases, the decision on the disconnection becomes feasible, for that a voltage outside the input voltage range in the normal operation is applied through the pull-up resistor 6 or the pull-down resistor 7 to the A/D converter 18 of the ECU 17.

Figure 3A:
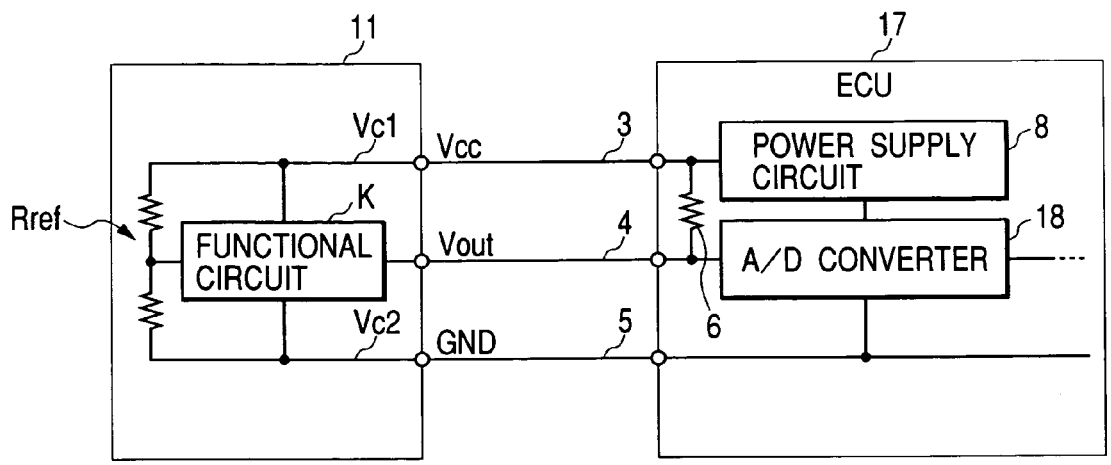
FIGS. 3A and 3B are illustrations useful for describing problems in disconnection detection.
Figure 3B:
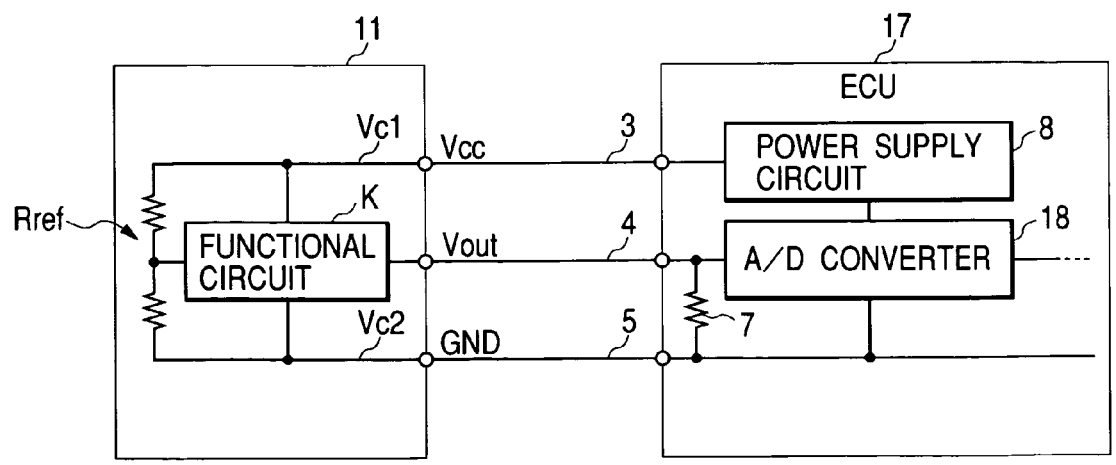
Figure 6A:
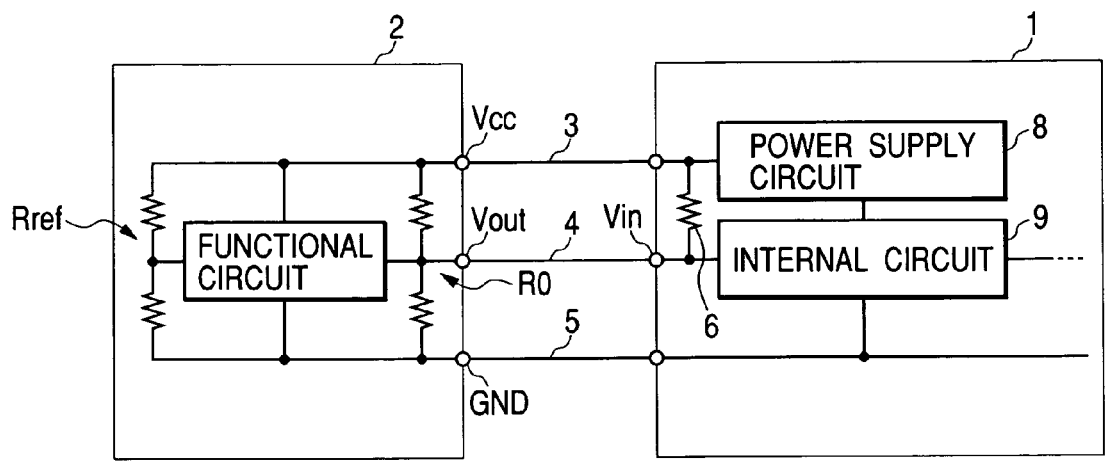
FIGS. 6A and 6B are illustrations for explaining a conventional arrangement of circuits including a control circuit and a sensor circuit.
Figure 6B:
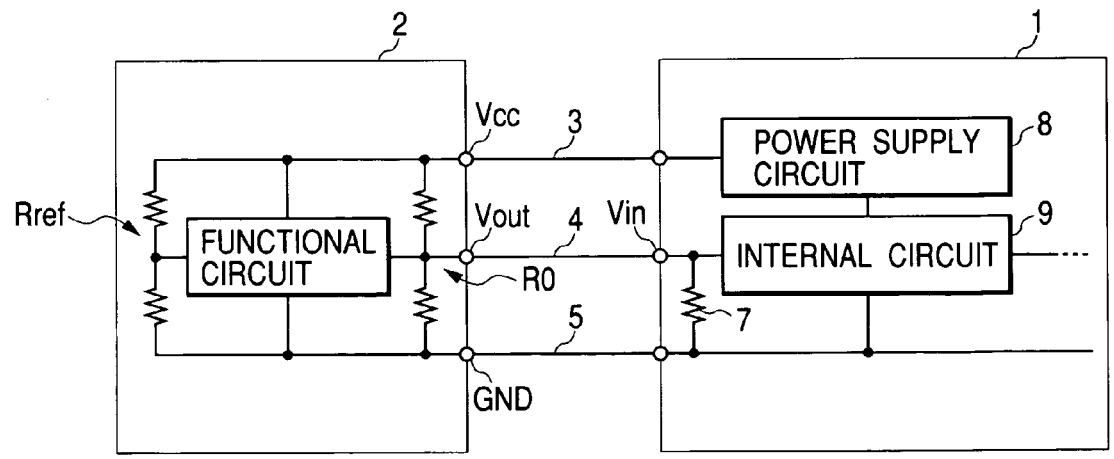

Each of the issues (a) and (b) will be separately described hereinbelow in the case of the operational amplifier OP3 in comparison with the conventional example. In FIGS. 3A and 3B, a functional circuit K is a circuit principally comprising the operational amplifiers OP1 to OP5, and Rref represents a reference voltage production resistor (for example, the resistor Rh, the resistor Ri or the like in FIG. 2) needed for the formation of the sensor circuit 11, and these illustrations are explanatory drawings corresponding to FIGS. 6A and 6B.

Figure 4A:
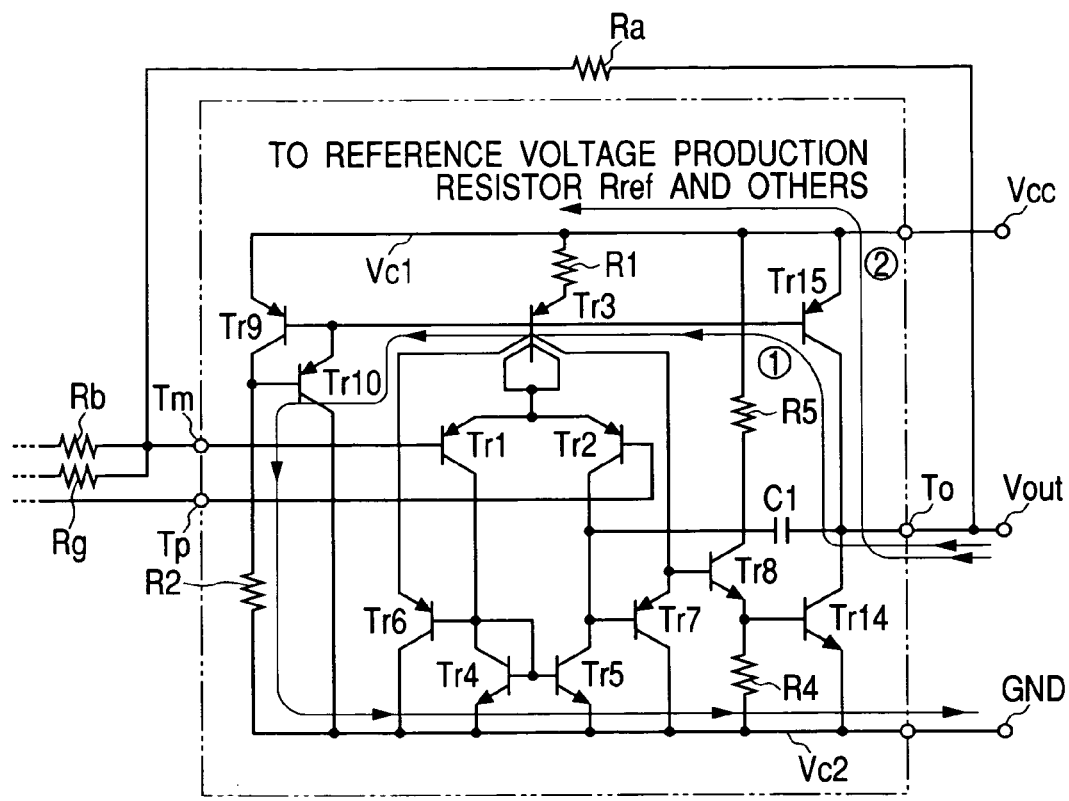
FIGS. 4A and 4B are illustrations for explaining a conventional flow of a current at the occurrence of a disconnection.
Figure 4B:
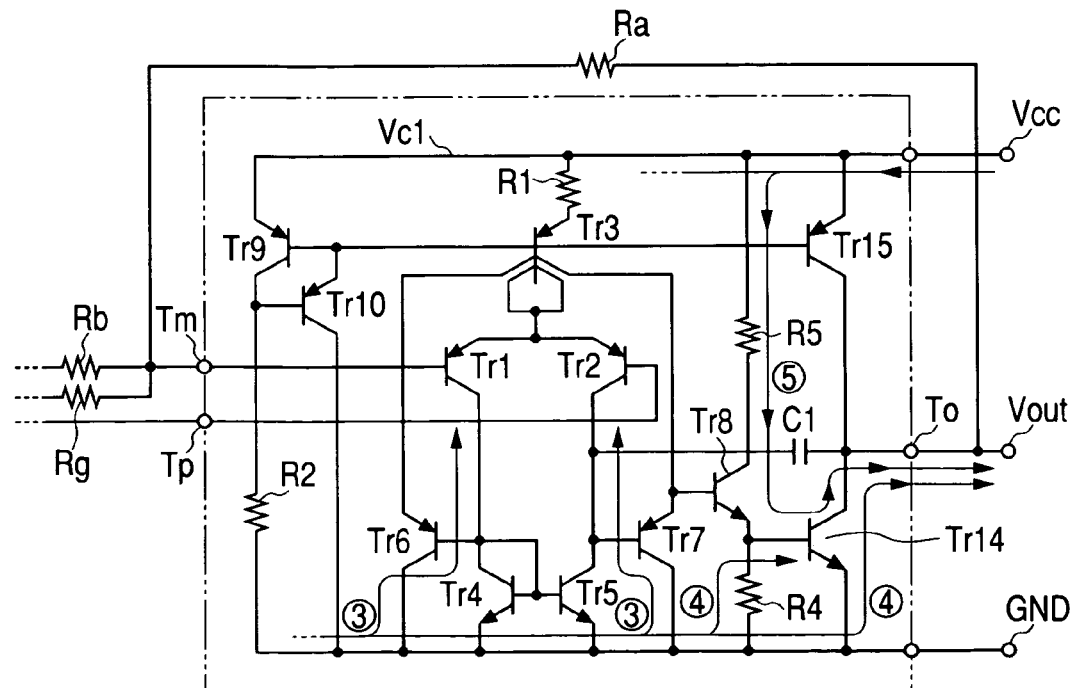

FIGS. 4A and 4b are illustrations of a conventional circuit which does not contain a countermeasure. FIGS. 4A and 4b are illustrations of the same circuit, showing a common operational amplifier corresponding to that in FIG. 1. Elements having the same functions as those in FIG. 1 are marked with the same reference numerals.

(a) In the Case of Connection of Pull-up Resistor 6 and Disconnection of Power Supply Line 3

In the conventional circuit example, when the connection of the pull-up resistor 6 is made in the ECU 17 side and the power supply line 3 falls into a disconnected condition in a state where the sensor circuit side has the arrangement shown in FIGS. 4A and 4B, it is confirmed that a current flows through a path indicated by circled numeral 1 or 2, or the like, in FIG. 4A. Although it is also considered that there is a current path from the output terminal Vout through the feedback resistor Ra into the differential input transistor Tr1, since the transistor Tr1 is a PNP transistor, the current does not flow from the input side of the differential amplification circuit A1. In the case of the current path indicated by the circled reference numeral 1, when the power is supplied from the power supply circuit 8 in the ECU 17 side, an energizing current flows through the pull-up resistor 6 to the sensor signal line 4 and flows through the output terminal Vout into the sensor circuit 11.

At this time, this energizing current flows through the collector-base (PN junction forward direction) of the PNP transistor Tr15 to the transistor Tr10. This is because the bases of the transistors Tr3, Tr9 and Tr15 are connected to each other. Moreover, the current flows through the emitter-base (PN junction forward direction), the resistor R2 and the ground line Vc2 into the ECU 17 side, thus forming a current loop (see the illustration).

In addition, in the case of the current path indicated by the circled reference numeral 2, due to the flow of the current through the current path indicted by the circled reference numeral 1 to the collector-base of the transistor Tr15, a current flows in the collector-emitter of the transistor Tr15 and runs through the reference voltage production resistor Rref (for example, the resistors Rh, Ri in FIG. 2) to the ground line Vc2 to establish a current path (see the illustration). Because of the flow of these currents, the voltage drop of the pull-up resistor 6 increases, and a voltage in the input voltage range (approximately 0.5V to 4.5V) in the normal operation is applied to the input of the A/D converter 18 in the ECU 17 side. Thus, with the conventional arrangement, difficulty is experienced in detecting a disconnection.

For this reason, for solving this problem, in FIG. 1, the constant-current circuit for the supply of a current to the output current source including the transistors Tr15 and Tr16 is provided separately from the bias circuit B1 and the differential amplification circuit A1 and the connections are made as mentioned above. At this time, even if a current flows from the output terminal Vout at the disconnection of the power supply line 3, the supply of the power supply voltage to the power supply terminal Vcc comes to a stop to turn off the transistors Tr17 and Tr18 of the constant-current circuit S2 so that the current does not flow in the output current source disappears. Therefore, the current path indicated by the circled reference numeral 1 in FIG. 4A disappears and the inflow of the current from the collector side of the transistor Tr15 disappears, and the current path indicated by the circled reference numeral 2 in FIG. 4A also disappears.

Thus, the pull-up resistor 6 is connected in the ECU 17 side and, when the power supply line 3 falls into a disconnected condition, no reverse current of the energizing current in the transistor Tr15 occurs and, hence, the disconnection detection can be made with high reliability without causing a voltage drop in the pull-up resistor 6.

(b) In the Case of Connection of Pull-down Resistor 7 and Disconnection of Ground Connection Line 5

When the connection of the pull-down resistor 7 is made in the ECU 17 side and the ground connection line 5 falls into a disconnected condition in a state where the sensor circuit side is arranged as shown in FIGS. 4A and 4B, it is confirmed that a current flows through paths indicated by circled reference numerals 3 to 5 in FIG. 4B, and other paths. That is, in the case of the current path indicated by the circled numeral 3, when the power supply voltage is supplied from the power supply circuit 8 in the ECU 17 side through the power supply line 3, the electric potential of the ground line Vc2 becomes unstable and a current flows through the reference voltage production resistor Rref (for example, the resistor Rh, Ri in FIG. 2) into the ground line Vc2, and this current flows therein through the collector-base (PN junction forward direction) of the PNP transistors Tr6 and Tr7 so that adverse influence appears from the collector side of the transistors Tr1 and Tr2 constituting the first-stage differential amplification circuit A1. Moreover, in the case of the path of the circled numeral 4, due to the flow of a base current through the resistor R4 into the transistor Tr14, a reverse current occurs through the emitter-collector of the transistor Tr14 and exits from the output terminal Vout.

In addition, in the case of the path of the circled numeral 5, because of the flows of the currents through the paths of the circled numerals 3 and 4 mentioned above, it is confirmed that the voltage between the base-emitter of the transistor Tr8 falls into an unstable state and the influence thereof causes a current to flow out from the output terminal Vout through the resistor R5 and the transistors Tr8 and Tr14 (see the illustration), and the current flowing out through the output terminal Vout comes to the pull-down resistor 7 to increase the voltage across the pull-down resistor 7 so that a voltage in the input voltage range (approximately 0.5V to 4.5V) in the normal operation is applied to the input of the A/D converter 18 and no detection of disconnection takes place.

Therefore, for solving this problem, according to this embodiment, as shown in FIG. 1, there are provided the diode D1, the current control circuit S1, the bias circuit B1 and the diode-connected transistor Tr11, which are in the states connected as mentioned above.

In this case, at the occurrence of a disconnection of the ground connection line 5, even if a current flows in the ground line Vc2, since the diode D1 is interposed between the collector of the PNP transistor and the ground line Vc2 in a state reverse-connected to prevent a current from flowing therein from the ground line Vc2 side (see the polarities in the illustration), the current does not flow into the transistors Tr1, Tr2, Tr6 and Tr7.

Still additionally, the employment of the transistor Tr11 can check (prevent) the energizing of the base current of the bipolar transistor Tr14 which flows therein from the ground line Vc2, and since no voltage drop occurs in the ECU 17 side, the disconnection detection can be made with high reliability without the functioning of the transistor Tr14.

Yet additionally, the employment of the current control circuit S1 between the power supply line Vc1 and the resistor R5 cuts off the operational current (the collector current of the transistor Tr8) flowing in the resistor R5 at the occurrence of a disconnection of the ground connection line 5 and, hence, the output side amplification circuit A2 does not function to stop the outflow of the current from the output terminal Vout. Moreover, since the resistor R3 is provided between the power supply line Vc1 and the base of the transistor Tr9 under a predetermined condition, it is possible to stop the functioning of the differential amplification circuit A1 at the occurrence of a disconnection of the ground connection line 5.

In particular, when the resistors R3, R2, R6 and R7 are provided at a predetermined ratio, it is confirmed that the current control function further improves. In this case, it is preferable that the ratio in resistance value between the resistors R6 and R7 or the ratio in resistance value between the resistors R3 and R2 is set at approximately several tens for one (for example, 10:1) in terms of maintaining the current control function in the normal operation and at the occurrence of a disconnection.

In this case, it is estimated that the ratio in impedance between the sensor circuit 11 and the ECU 17 becomes at least one-digit, two-digit or more (for example, ten, several tens, more-than-several-hundreds for one). Accordingly, when the connection of the pull-down resistor 7 is made and the ground connection line 5 falls into disconnection, the interruption of the current paths indicated by the circled numerals 3 to 5 occurs and, hence, no voltage drop occurs in the pull-down resistor 7, thereby ensuring a high-reliability disconnection detection.

That is, even if the normal operation is made in a state where the current balance in the circuits is kept appropriately, in the conventional example, the reverse current occurs in the transistors Tr6, Tr7, Tr14 and Tr15 due to the disconnection any one of the connection lines 3 to 5 between the sensor circuit 11 and the ECU 17 to break the current balance so that difficulty is encountered in detecting the disconnection. On the other hand, the diode D1, the current control circuit S1, the constant-current circuit S2 and the diode-connected transistor Tr11 are provided to check (prevent) the reverse current in the respective transistors Tr6, Tr7, Tr14 and Tr15 and, hence, the disconnection detection can be made with high reliability without developing the reverse currents of the respective transistors even at the occurrence of a disconnection of the connection lines 3 to 5.

According to the first embodiment described above, the input terminal Vin in the ECU 17 side is connected directly to the collectors of the transistors Tr14 and Tr15 without placing a resistance element therebetween and a resistor having a resistance value of several kΩ to several tens kΩ is employed as the pull-up resistor 6 or the pull-down resistor 7 for the energizing to the collector of the transistor Tr14 or Tr15, thus supplying an energizing current from the ECU 17 side through the terminals Vcc, Vout and GND to the sensor circuit 11 in the normal operation. Therefore, even if the terminals Vcc, Vout and GND are terminals tin-plate-treated, as compared with the conventional case, it is possible to enhance the energizing current, which can prevent the contact resistance at the terminal contacts from increasing to the utmost.

In addition, since the current control circuit S1, the constant-current circuit S2, the bias circuit B1 and the transistors Tr11 and Tr16 are provided so that the impedance of the sensor circuit 11 side at the occurrence of a disconnection of the power supply line 3 (or the ground connection line 5) is set to be higher by at least one-digit or more than the resistance value of the pull-up resistor 6 (or the pull-down resistor 7) of the ECU 17, no voltage drop occurs in the pull-up resistor 6 or the pull-down resistor 7, thus achieving a high-reliability disconnection detection.

Considering the current path at a disconnection detection in the entire sensor circuit 11, not only the operational amplifier OP3 directly connected to the terminal Vout but also the operational amplifier OP1, OP2 or the like connected through the resistor Ra or the like provide a like current path. For this reason, the arrangement of the operational amplifier OP3 described in this embodiment also applies to these operational amplifiers OP1 and OP2. This enables a higher-reliability disconnection detection.

Incidentally, if a parasitic element exists in the elements such as the transistors Tr1 to Tr17 constituting the operational amplifiers OP3 and others, the parasitic element can provide a bypass path for the reverse current checking means D1, the current checking means Tr11 and others to hinder the functions of these means. For this reason, for example, it is preferable to employ a wafer process (oxide film insulating/separating process or the like) for eliminating the parasitic element, thereby removing the bypass path originating from the parasitic element.

Second Embodiment

Figure 5:
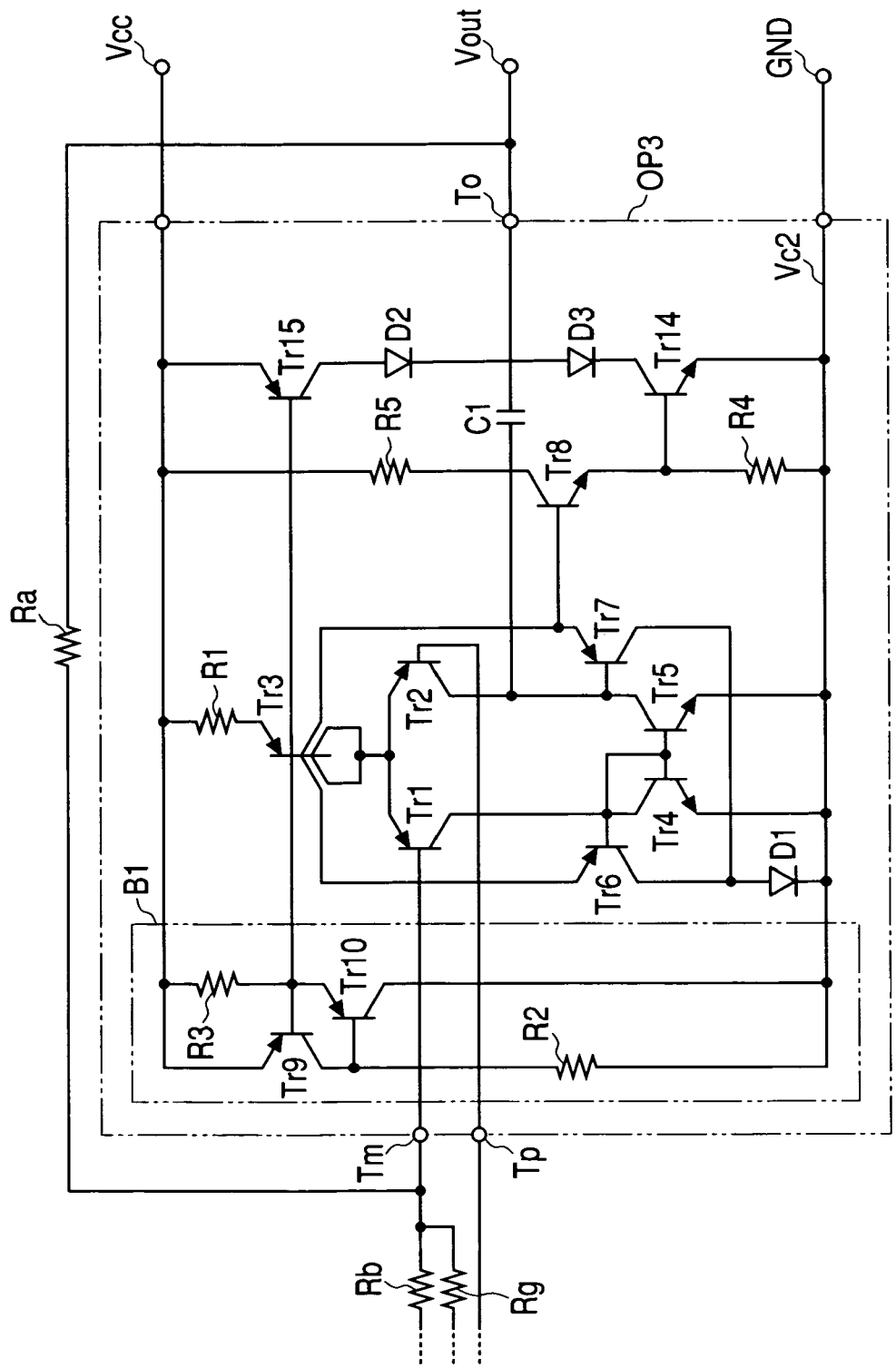
FIG. 5 is an illustration of an electrical arrangement of a portion of a sensor circuit according to a second embodiment of the present invention.

FIG. 5 is an illustration useful for explaining a second embodiment of the present invention, and the difference from the first embodiment is that, in place of the current control circuit S1 and the constant-current circuit S2 of the operational amplifier, a diode is provided on the output side amplification circuit A2 side to check the reverse current of the transistors Tr14 and Tr15. The same parts as those in the first embodiment are marked with the same reference numerals, and the description thereof will be omitted for brevity.

In FIG. 5, a diode D2 having a polarity illustration is placed between the collector of the transistor Tr15 of the operational amplifier OP3 and the output terminal Vout. Moreover, a diode D3 having the polarity illustrated is interposed between the collector of the transistor Tr14 and the output terminal Vout.

In this arrangement, for example, when the connection of the pull-up resistor 6 is made in the ECU 17 side, the reverse current of the transistor Tr15 is checked by the diode D2. That is, it is possible to cut off the current paths indicated by the circled numerals 1 and 2 in FIG. 4A. Moreover, if the connection of the pull-down resistor 7 is made in the ECU 17 side, the reverse current of the transistor Tr14 is checked by the diode D3. That is, it is possible to cut off the current paths indicated by the circled numerals 4 and 5 in FIG. 4B.

As compared with the first embodiment, although the output voltage range of the operational amplifier OP3 becomes smaller, this second embodiment can provide the effects similar to those of the first embodiment.

Other Embodiments

It should be understood that the present invention is not limited to the above-described embodiments, and that it is possible to cover, for example, the following changes and modifications of the embodiments of the invention.

Although the above-described embodiments employs the functional circuit K principally comprising the operational amplifiers OP1 to OP5, if the sensor circuit 11 includes transistors, it is also possible to use this circuit 11 as the functional circuit. In this case, it is also possible to use a circuit whereby an energizing current is directly supplied from the ECU 17 through the output terminal Vout and others to the collector of a sensor circuit 11 side transistor in the normal operation and, at the occurrence of disconnection of the connection lines 3 to 5, the sensor circuit 11 side impedance becomes higher than the ECU 17 side impedance.

Moreover, although the above-described embodiments employ a bipolar transistor, it is also possible to use an FET. Still moreover, it is also acceptable that the bias circuit B1 and the resistors R6, R7 and transistor Tr13 of the current control circuit S1 are put to common use.

What is claimed is:

1. A disconnection detecting circuit for a sensor apparatus comprising:
a control circuit:
a sensor circuit including a functional circuit having one or a plurality of transistors for outputting a sensor signal to said control circuit upon receipt of power supply from said control circuit in a state where a plurality of connection lines and terminals are interposed between said control circuit and said sensor circuit, with said disconnection detecting circuit being made to detect a disconnection of at least one of said connection lines; and
reverse current checking means for checking a reverse current in said transistor of said functional circuit at the occurrence of the disconnection of said connection line, wherein:
in a normal operation, an energizing current is supplied directly from said control circuit through said terminal to a collector or drain of said transistor in the sensor circuit side,
in response to the occurrence of a disconnection of said connection line, an impedance in the sensor circuit side is set to be higher than an impedance in the control circuit side,
said functional circuit has one or a plurality of amplification circuits and said amplification circuit includes an output side amplification circuit for carrying out inputting and outputting of a direct-current signal from an output terminal of said sensor circuit through said connection line, and
said reverse current checking means is made to check the reverse current in said transistor of said output side amplification circuit at the occurrence of the disconnection of said connection line.

2. The circuit according to claim 1, wherein said amplification circuit is driven upon receipt of the supply of a current from a constant-current circuit, and said output side amplification circuit is equipped with an output current source arranged in the form of a current mirror circuit, said constant-current circuit is made to supply a current to said output current source and is provided separately from a constant-current circuit for supplying a current to an amplification circuit other than said output side amplification circuit.

3. The circuit according to claim 1, wherein said transistor is a bipolar transistor, and a current checking means is provided to check the supply of a base current to said bipolar transistor at the occurrence of the disconnection of said connection line.

4. The circuit according to claim 1, wherein said reverse current checking means is constructed by reverse-connecting a diode or a diode-connected transistor.

5. The circuit according to claim 3, wherein said current checking means is constructed by reverse-connecting a diode or a diode-connected transistor.

6. A disconnection detecting circuit for a sensor apparatus comprising:
a control circuit;
a sensor circuit including a functional circuit having one or a plurality of transistors for outputting a sensor signal to said control circuit upon receipt of power supply from said control circuit in a state where a plurality of connection lines and terminals are interposed between said control circuit and said sensor circuit, with said disconnection detecting circuit being made to detect a disconnection of at least one of said connection lines; and reverse current checking means for checking a reverse current in said transistor of said functional circuit at the occurrence of the disconnection of said connection line, wherein:

in a normal operation, an energizing current is supplied directly from said control circuit through said terminal to a collector or drain of said transistor in the sensor circuit side, in response to the occurrence of a disconnection of said connection line, an impedance in the sensor circuit side is set to be higher than an impedance in the control circuit side, and said transistor is a PNP bipolar transistor, and a collector of said PNP bipolar transistor is connected to a power supply bus side producing a lower side reference electric potential in an operation of said functional circuit, and said reverse current checking means is interposed between said collector of said PNP bipolar transistor and said power supply bus having said lower side reference electric potential to check a reverse current in said PNP bipolar transistor.

7. A disconnection detecting circuit for a sensor apparatus, comprising a control circuit and a sensor circuit including a functional circuit having one or a plurality of transistors for outputting a sensor signal to said control circuit upon receipt of power supply from said control circuit in a state where a plurality of connection lines and terminals are interposed between said control circuit and said sensor circuit, with said disconnection detecting circuit being made to detect a disconnection of at least one of said connection lines, wherein:

in a normal operation, an energizing current is supplied directly from said control circuit through said terminal to a collector or drain of said transistor in the sensor circuit side, in response to the occurrence of a disconnection of said connection line, an impedance in the sensor circuit side is set to be higher than an impedance in the control circuit side, and said functional circuit includes an amplification circuit having said one or plurality of transistors, and a current control circuit is provided to cut off an operational current for said amplification circuit at the occurrence of the disconnection of said connection line.

8. The circuit according to claim 7, wherein said amplification circuit includes an output side amplification circuit for carrying out inputting/outputting of a direct-current signal from a terminal of said sensor circuit through said connection line, and said current control circuit cuts off an operational current for said output side amplification circuit at the occurrence of the disconnection of said connection line.

9. The circuit according to claim 7, wherein said current control circuit is constructed with a current mirror circuit including a first transistor to which a current is inputted from a power supply bus of said sensor circuit and a second transistor whose first and second transistor control terminals are connected to each other, and a resistance element is connected between said power supply bus of said sensor circuit and said transistor control terminals.

* * * * *